US007482679B2

(12) United States Patent
Aripin et al.

(10) Patent No.: US 7,482,679 B2
(45) Date of Patent: Jan. 27, 2009

(54) LEADFRAME FOR A SEMICONDUCTOR DEVICE

(75) Inventors: Azhar Aripin, Selangor (MY); Norsaidi Sariyo, Selangor (MY)

(73) Assignee: Freescale Semiconductor, Inc., Austin, TX (US)

( * ) Notice: Subject to any disclaimer, the term of this patent is extended or adjusted under 35 U.S.C. 154(b) by 70 days.

(21) Appl. No.: 11/569,113

(22) PCT Filed: Oct. 14, 2005

(86) PCT No.: PCT/US2005/037064

§ 371 (c)(1),
(2), (4) Date: Jul. 25, 2007

(87) PCT Pub. No.: WO2006/052382

PCT Pub. Date: May 18, 2006

(65) Prior Publication Data

US 2008/0283978 A1 Nov. 20, 2008

(30) Foreign Application Priority Data

Nov. 9, 2004 (MY) ............................... PI20044665

(51) Int. Cl.
*H01L 23/495* (2006.01)

(52) U.S. Cl. ....................... 257/666; 257/670; 257/675; 257/E23.042

(58) Field of Classification Search ................. 257/666, 257/670, 675, E23.042
See application file for complete search history.

(56) References Cited

U.S. PATENT DOCUMENTS 5,327,008 A 7/1994 Djennas et al.
5,442,234 A 8/1995 Liang
5,514,631 A 5/1996 Cottringer et al.
5,532,905 A 7/1996 Moore
5,633,528 A * 5/1997 Abbott et al. ............... 257/666
5,886,396 A 3/1999 Carney et al.
5,929,514 A 7/1999 Yalamanchili
6,198,163 B1 3/2001 Crowley et al.

OTHER PUBLICATIONS

PCT International Preliminary Report on patentability for PCT/US2005/037064 mailed Jul. 10, 2008.

* cited by examiner

*Primary Examiner*—Evan Pert
*Assistant Examiner*—William Harriston
(74) *Attorney, Agent, or Firm*—Charles Bergere

(57) ABSTRACT

A leadframe (40) for a semiconductor device has a radially extending leads (42) having inner lead portions (44) and outer lead portions (46), and a dam bar (48) that mechanically connects the leads (42) together near the outer lead portions (46). The inner lead portions (44) define an open area having a central region and the dam bar (48) defines a leadframe outer perimeter. A generally X-shaped die support member has arms (50) that extend from the leadframe outer perimeter and meet at the central region. A heat sink includes sections (64) that are formed between adjacent pairs of the die support member arms (50). The heat sink sections (64) are connected to the die support member arms (50) with down set tie bars (66) such that the heat sink lays in a plane below a plane of the die support member arms (50).

19 Claims, 3 Drawing Sheets

LEADFRAME FOR A SEMICONDUCTOR DEVICE

BACKGROUND OF THE INVENTION

The present invention relates to integrated circuits and packaged integrated circuits and, more particularly, to a leadframe for an integrated circuit.

An integrated circuit (IC) die is a small device formed on a semiconductor wafer, such as a silicon wafer. A leadframe is a metal frame that usually includes a paddle that supports an IC die that has been cut from the wafer. The leadframe has lead fingers that provide external electrical connections. That is, the die is attached to the die paddle and then bonding pads of the die are connected to the lead fingers via wire bonding or flip chip bumping to provide the external electrical connections. A package is formed by encapsulating the die and wire bonds or flip chip bumps with a protective material, such as a mold compound. Depending on the package type, the external electrical connections may be used as-is, such as in a Thin Small Outline Package (TSOP) or quad-flat no-lead (QFN), or further processed, such as by attaching spherical solder balls for a Ball Grid Array (BGA). These terminal points allow the die to be electrically connected with other circuits, such as on a printed circuit board.

Referring to FIG. 1, a top plan view of a leadframe 10 having lead fingers 12 and a large, solid die paddle 14 is shown. The lead fingers 12 have inner lead portions 16 proximate to the die paddle 14 and outer lead portions 18. The outer lead portions 18 are connected together with a tie bar 20 that is spaced from and encircles the die paddle 14. The corners of the die paddle 14 are connected to the tie bar 20 with support pins 22. An IC die (not shown) that would be attached to the die paddle 14 would have a footprint, shown in dashed lines, that is generally smaller than that of the die paddle 14. Leadframes are typically made of copper, a copper alloy, or an iron-nickel alloy.

Package cracking is a common problem in plastic encapsulated semiconductor devices. Such cracking arises from a combination of factors. One factor is internal delamination between the plastic encapsulant material and the die paddle due to the different coefficients of thermal expansion (CTE) of the metal leadframe and the plastic encapsulant. As a result of this CTE mismatch, stress is created at the plastic-die paddle interface as the semiconductor device experiences temperature changes. The stress is relieved through delamination of the plastic-die paddle interface. Another cause of package cracking is moisture absorption. After the plastic-die paddle interface becomes delaminated, moisture from the environment diffuses through the molding compound to the delaminated area. Once moisture accumulates in the package, rapid temperature increases will cause the moisture to vaporize and expand, thereby creating an internal pressure pocket in the delaminated area. The surrounding plastic cracks in order to relieve the pressure at the pressure pocket. Such delamination and cracking often occur during a solder reflow process, where the semiconductor device experiences a rapid increase in temperature.

Numerous methods are available for dealing with the problem of package cracking. One method is dry packing, which involves baking plastic encapsulated devices sufficiently to reduce moisture content and packaging the devices into moisture resistant packets. The device is then attached before a sufficient amount of moisture to cause cracking can be absorbed into the package through exposure to ambient conditions. This method, however, adds an additional step to the assembly process and requires users to keep track of how long a device is exposed to ambient conditions. Other methods of reducing delamination and cracking involve improving adhesion between the die and the die paddle, such as by roughening the die paddle, forming holes or dimples in the die paddle, and the use of a window-frame type die paddle, in which a large area is cut from the die paddle.

FIG. 2 shows another leadframe design that reduces delamination and plastic cracking. The leadframe 30 has lead fingers 32 and an X-shaped die paddle 34. Like the lead fingers 12 shown in FIG. 1, the lead fingers 32 have inner lead portions and outer lead portions, and a tie bar 36 that connects the lead fingers 32. The corners of the X-shaped die paddle 34 are connected to the tie bar 36 with support pins 38. The support pins 38 are thinner than the tie bar 36. An IC die (not shown) that would be attached to the die paddle 34 would have a footprint as shown in dashed lines. Note that portions of the IC die would not be in contact with the die paddle 34 when attached thereto. Note also that the die paddle 34 can accommodate various size IC die and still perform the same function and achieve the same goals, i.e., reduced delamination and cracking. The X-shaped flag design improves adhesion between the lead frame and the encapsulating material by also providing a die-plastic (encapsulating material) interface.

While the X-shaped die flag design has a high moisture sensitivity level performance, some devices, such as power transistors, require high thermal performance. That is, it is preferred that such devices include a heat sink. The present invention provides a leadframe for a semiconductor device with good thermal performance, high moisture sensitivity level performance, and can be used with various die sizes.

BRIEF DESCRIPTION OF THE DRAWINGS

The following detailed description of a preferred embodiment of the invention, will be better understood when read in conjunction with the appended drawings. For the purpose of illustrating the invention, there is shown in the drawings an embodiment that is presently preferred. It should be understood, however, that the invention is not limited to the precise arrangement and instrumentalities shown. In the drawings.

DETAILED DESCRIPTION OF PREFERRED EMBODIMENTS

Figure 2:
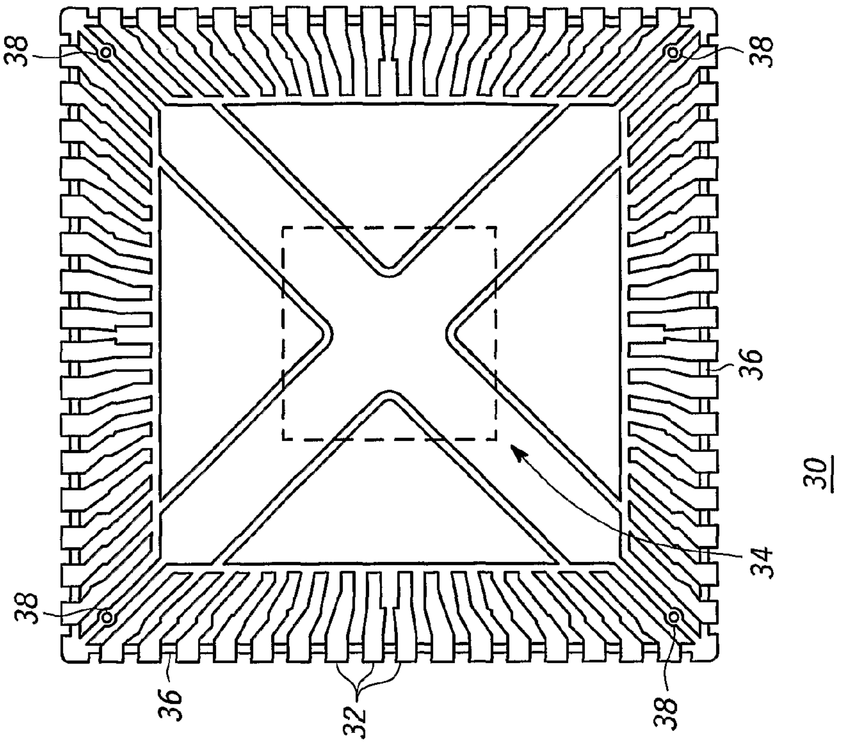
FIG. 2 is an enlarged, perspective view of a conventional leadframe having an X-shaped die paddle.
Figure 1:
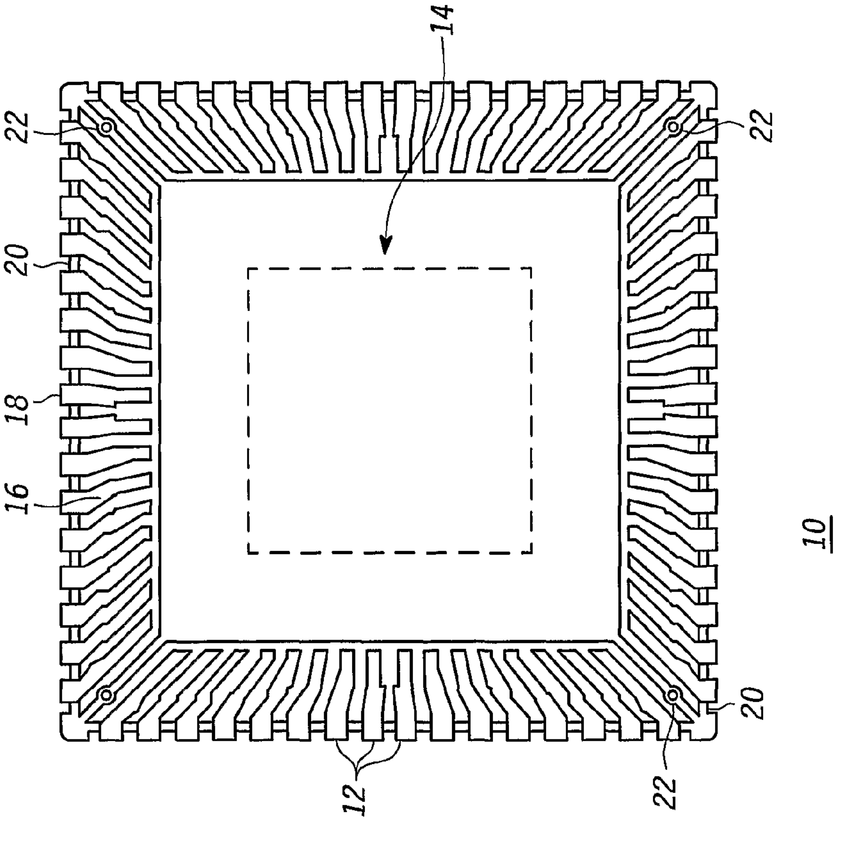
FIG. 1 is an enlarged, perspective view of a conventional leadframe.

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are intended to be encompassed within the spirit and scope of the invention. As will be understood by those of skill in the art, the present invention can be applied to various packages and package types.

Certain features in the drawings have been enlarged for ease of illustration and the drawings and the elements thereof are not necessarily in proper proportion. However, those of ordinary skill in the art will readily understand the details of the invention. In the drawings, like numerals are used to indicate like elements throughout.

In one embodiment, the present invention is a leadframe for a semiconductor device. The leadframe has a plurality of radially extending leads having inner lead portions and outer lead portions. The inner lead portions define an open area having a central region. A dam bar mechanically connects the leads together near to the outer lead portions, and defines a leadframe outer perimeter. A generally X-shaped die support member has a plurality of arms that extend from the leadframe outer perimeter and meet at the central region. A heat sink has a plurality of sections formed between adjacent pairs of the die support member arms. A plurality of down set tie bars connects the heat sink sections to adjacent ones of the die support member arms. The heat sink lies in a plane below a plane of the die support member. In one embodiment, the heat sink sections are triangular and the leads, the die support member, and the heat sink all lie in separate planes.

In another embodiment, the present invention is a semiconductor device including a plurality of radially extending leads having inner lead portions and outer lead portions. The inner lead portions define an open area having a central region. A generally X-shaped die support member has a plurality of arms located within the open area and meeting at the central region. A heat sink has a plurality of sections formed between adjacent pairs of the die support member arms. A plurality of down set tie bars connects the heat sink sections to adjacent ones of the die support member arms. The heat sink sections lie in a plane below a plane of the die support member arms. A semiconductor die is mounted to the X-shaped die support member. The semiconductor die is electrically coupled to the plurality of leads, and a mold compound covers the semiconductor die, at least the inner lead portions of the leads, and the tie bars.

Figure 3:
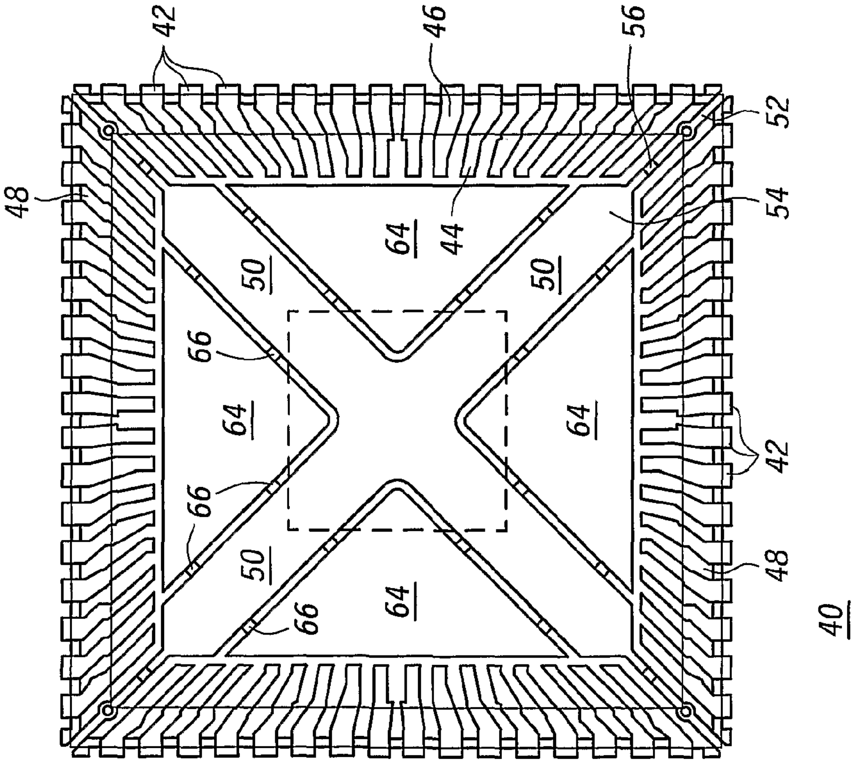
FIG. 3 is an enlarged, top plan view of a leadframe in accordance with an embodiment of the present invention.

Referring now to FIG. 3, an enlarged, top plan view of a leadframe 40 in accordance with an embodiment of the present invention is shown. The leadframe 40 includes a plurality of radially extending leads 42 having inner lead portions 44 and outer lead portions 46. The inner lead portions 44 define an open area having a central region. A dam bar 48 mechanically connects the leads 42 together near to the outer lead portions 46. The dam bar 48 defines a leadframe outer perimeter. Although only one leadframe is shown, the leadframe 40 may be part of an array of leadframes or one in a strip of leadframes.

The leadframe 40 has a generally X-shaped die support member having a plurality of arms 50 that extend from the leadframe outer perimeter and meet at the central region. Each arm 50 of the die support member has a first portion 52 of a first width and a second portion 54 of a second width. In the embodiment shown, the second width is greater than the first width. That is, the first portions 52 are narrower than the second portions 54. The second portions 54 extend from the open area and meet at the central region. The second portions 54 receive and support a die (not shown). An outline of the die is shown in dashed lines. It should be noted that the die support member can accommodate various size die. That is, the die may be larger or smaller than that indicated by the dashed lines in FIG. 3. Also, although the leadframe 40 shown is generally square-shaped, this is not a requirement. That is, the leadframe and the leadframe central region shapes are somewhat dependent on the package moisture sensitivity level (MSL) requirement. For packages that require high MSL performance, the x-flag central region is preferred. Thus, it should be understood by those of skill in the art that the circuit and package sizes may vary and that the shape of a packaged device formed with the leadframe 40 may vary too.

Figure 4:
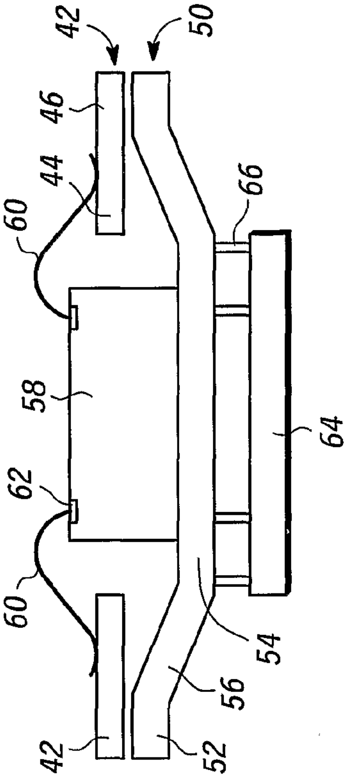
FIG. 4 is an enlarged, cross-sectional view of the leadframe of FIG. 3 with an IC die attached thereto.

Referring to FIG. 4, which is a cross-sectional view of the leadframe 40, the arms 50 may include a bend 56 so that the second portions 54 of the arms 50 lie in a different plane than the leads 42. More particularly, in one embodiment of the invention, the arms 50 include the bend 56 so that the second portion 54 lies in a plane that is parallel to and below a plane of the leads 42. A semiconductor die 58 is mounted on the second portions 54 of the arms 50. A bottom surface of the die 58 is below the plane of the leads 42 and a top surface of the die 58 is somewhat above the leads 42. By decreasing a difference in height between the top surface of the die 58 and the leads 42, shorter length wires may be used to electrically couple the die 58 to the leads 42, and the overall package will have a lower profile. As shown in FIG. 4, in one embodiment of the invention, the die 58 is electrically coupled to the leads 42 via wires 60. The wires 60 are bonded to die bonding pads 62 and the leads 42 using a known wire bonding process. Typically the bonding pads 62 are formed around the perimeter of the top surface of the die 58. The wires 60 are of a type well known to those of skill in the art and typically are formed of copper or gold. Various diameter wires may be used depending on the number of circuit I/Os and the size of the die 58.

Referring now to FIGS. 3 and 4, the leadframe 40 includes a heat sink having a plurality of sections 64 formed between adjacent pairs of the die support member arms 50 and located in the open area. In one embodiment of the invention, the heat sink sections 64 are generally triangular in shape and surrounded on two sides by the second portions 54 of adjacent die support member arms 50 and on a third side by the inner lead portions 44 of the leads 42. The heat sink sections 64 are connected to the second portions 54 of the respective adjacent arms 50 by a plurality of down set tie bars 66. The down set tie bars 66 mechanically connect the heat sink sections 64 to adjacent ones of the die support member arms 50. As shown in FIG. 3, each heat sink section 64 may be connected to an arm second portion 54 with two down set tie bars 66. The down set tie bars 66 extend in a direction that is generally perpendicular to the arms 50 such that the heat sink sections 64 lie in a plane below a plane of the die support member arms 50. Thus, as illustrated in FIG. 4, in one embodiment of the invention, the leads 42, the second sections 54 of the die support members 50, and the heat sink sections 64 lie in separate, but parallel planes.

The leadframe 40 preferably is formed from a single sheet of metal via cutting, stamping, etching, or combinations of cutting, stamping and etching. Such cutting, stamping and etching processes are well known in the art of leadframe manufacturing, so a detailed description is not necessary for a complete understanding of the invention. The metal from which the leadframe is formed can be copper, aluminum, iron, nickel, or other metals or metal alloys. Further, the metal may be plated, such as with silver, gold, platinum, palladium, tin or other metals. Lead (Pb) may also be used, although it is preferred to minimize or phase out the usage of lead (Pb). In one embodiment, the leadframe 40 is formed of copper that is pre-plated with tin. The size and shape, as well as the number of leads 42, of the leadframe 40 is determined based on the size, shape and number of bonding pads of the semiconductor die 58. Although the lead 42 generally are the same length and width, the leads 42 may vary in length and width. For example, leads used for power and ground may be wider than signal leads. Further, many leadframes may be formed at the same time, such that the leadframes are supplied on a roll (like a roll of photographic film) or in a matrix, such as a 3×3 or 4×4 matrix of leadframes. Both leadframe panels and leadframe strips are known by those of skill in the art.

Figure 5:
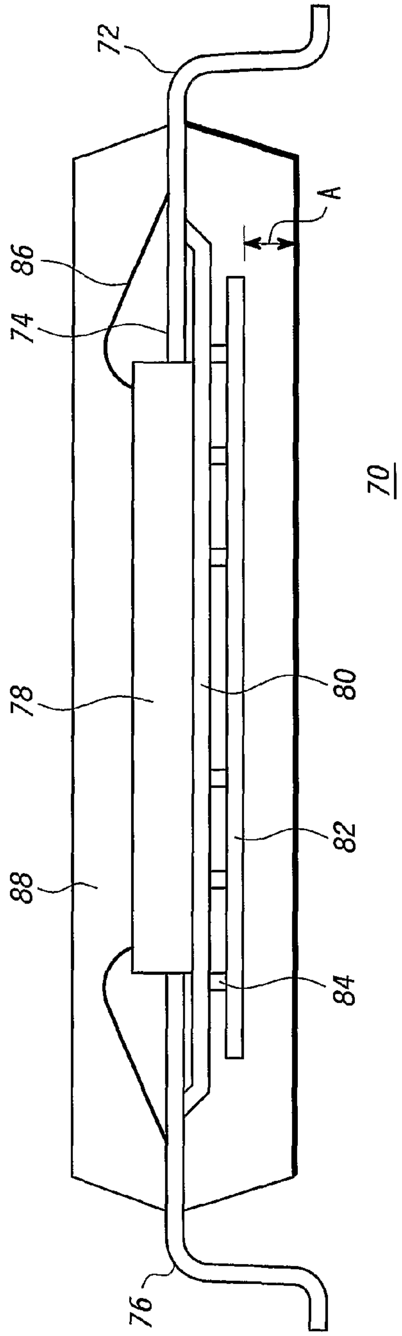
FIG. 5 is an enlarged, cross-sectional view of a packaged semiconductor device in accordance an embodiment of the present invention.

Referring now to FIG. 5, an enlarged cross-sectional view of one embodiment of a semiconductor device 70 in accordance with the present invention is shown. The semiconductor device 70 includes a plurality of radially extending leads 72 having inner lead portions 74 and outer lead portions 76. The inner lead portions define an open area having a central region. The central region is sized and shaped to receive a semiconductor die 78. A generally X-shaped die support member 80 is provided to support the die 78. The die 78 may be of a type known to those of skill in the art, such as a circuit formed on and cut from a silicon wafer. Typical die sizes may range from 2 mm×2 mm to 12 mm×12 mm and have a thickness ranging from about 3 mils to about 21 mils. A heat sink 82 is provided for conducting heat generated by the die 78 away from the die 78. As shown in FIG. 3, the die support member 80 has a plurality of arms located within the open area and meeting at the central region, and the heat sink 80 has a plurality of sections formed between adjacent pairs of the die support member arms.

A plurality of down set tie bars 84 connect the heat sink sections to adjacent ones of the die support member arms such that the heat sink 82 lies in a plane below a plane of the die support member 80. The semiconductor die 78 is mounted to the X-shaped die support member 80. The die 78 may be secured to the die support member 80 using a die attach adhesive or solder, as is known in the art. As shown in FIG. 5, the leads 72, the die support member 80, and the heat sink sections 82 lie in three separate, parallel planes.

A plurality of wires 86 electrically couple the semiconductor die 78 to the inner lead portions 74 of the leads 72. The wires 86 may be connected to die bonding pads (not shown) and the inner lead portions 74 using standard wire bonding techniques. A mold compound 88 covers the semiconductor die 78, at least the inner lead portions 74 of the leads 72, and the tie bars 84. In the embodiment shown, the mold compound 88 also covers the heat sink 82. For example, the thickness of the mold compound 88 from a bottom of the heat sink 82 to an outer edge of the mold compound 88 may be about 14 mils, as indicated by line A. The mold compound also fills an area between the heat sink sections 82 and the die support member 80. The mold compound 88 may comprise a plastic as is commonly used in packaged electronic devices. The mold compound 88 is formed over the die 78, the inner lead portions 74, and between the die support member 80 and the heat sink 82 preferably by injection during an injection molding process. As shown in FIG. 5, the outer lead portions 76 may be bent or shaped using a trim and form operation as is known in the art.

Figure 6:
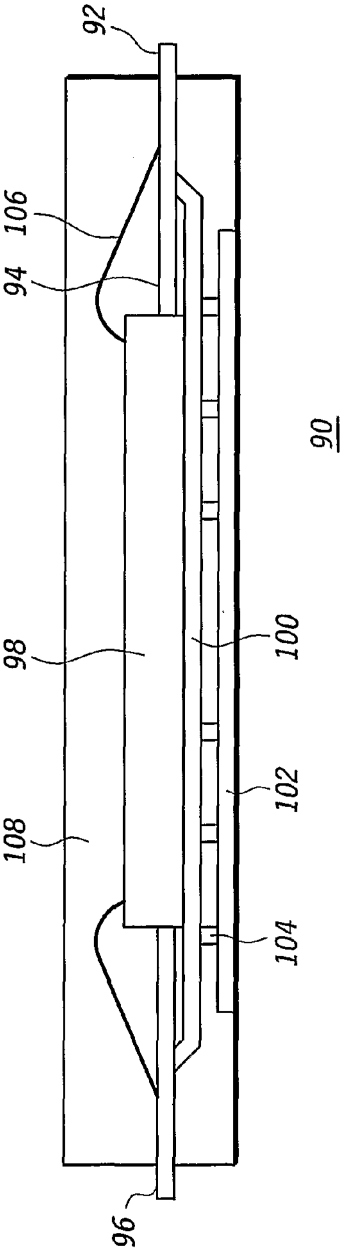
FIG. 6 is an enlarged, cross-sectional view of a packaged semiconductor device in accordance with another embodiment of the present invention.

Referring now to FIG. 6, another embodiment of a packaged semiconductor device 90 is shown. Like the device 70 shown in FIG. 5, the device 90 includes a plurality of radially extending leads 92 having inner lead portions 94 and outer lead portions 96. The inner lead portions define an open area having a central region that is sized and shaped to receive a semiconductor die 98. A generally X-shaped die support member 100 is provided to support the die 98. The die 98 is mounted to the X-shaped die support member 100 and attached thereto using a die attach adhesive or solder, as is known in the art. A heat sink 102 is provided for conducting heat generated by the die 98 away from the die 98. The die support member 100 has a plurality of arms located within the open area and meeting at the central region, and the heat sink 102 has a plurality of sections formed between adjacent pairs of the die support member arms.

A plurality of down set tie bars 104 connect the heat sink sections to adjacent ones of the die support member arms such that the heat sink 102 lies in a plane below a plane of the die support member 100. As shown in FIG. 6, the leads 92, the die support member 100, and the heat sink 102 lie in three separate, parallel planes.

A plurality of wires 106 electrically couples the semiconductor die 98 to the inner lead portions 94 of the leads 92. The wires 106 may be connected to die bonding pads (not shown) and the inner lead portions 94 using standard wire bonding techniques. A mold compound 108 covers the semiconductor die 98, the inner lead portions 94 of the leads 92, the tie bars 104, and at least one surface of the heat sink 102. In the embodiment shown, the mold compound 108 does not cover a bottom or outer surface of the heat sink 102. That is, the heat sink 102 is exposed. This allows the heat sink to be attached to a PCB. The packaged device 90 also has a lower profile than the packaged device 70. The mold compound 108 fills an area between the heat sink 102 and the die support member 100. As shown in FIG. 6, the outer lead portions 96 extend beyond the mold compound 108. The outer lead portions 96 may be left as is, bent, or trimmed, as desired.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A leadframe for a semiconductor device, comprising:

a plurality of radially extending leads having inner lead portions and outer lead portions, wherein the inner lead portions define an open area having a central region;

a dam bar that mechanically connects the leads together near to the outer lead portions, wherein the dam bar defines a leadframe outer perimeter;

a generally X-shaped die support member having a plurality of arms that extend from the leadframe outer perimeter and meet at the central region;

a heat sink having a plurality of sections, the heat sink sections being formed between adjacent pairs of the die support member arms; and a plurality of down set tie bars connecting the heat sink sections to adjacent ones of the die support member arms, wherein the heat sinks lie in a plane below a plane of the die support member arms.

2. The leadframe of claim 1, wherein the heat sink sections are triangular.

3. The leadframe of claim 1, wherein the leads, the die support member, and the heat sink lie in separate planes.

4. The leadframe of claim 1, wherein each arm of the die support member has a first portion of a first width and a second portion of a second width that is greater than the first width, wherein the second portions receive and support a die.

5. The leadframe of claim 1, wherein the leadframe is formed of a metal plated with silver, gold or platinum.

6. The leadframe of claim 5, wherein the metal comprises an alloy of copper, aluminum or iron and nickel.

7. The leadframe of claim 1, wherein the leadframe is formed from a single sheet of metal.

8. A semiconductor device, comprising:
- a plurality of radially extending leads having inner lead portions and outer lead portions, wherein the inner lead portions define an open area having a central region;
- a generally X-shaped die support member having a plurality of arms located within the open area and meeting at the central region;
- a heat sink having a plurality of sections, the heat sink sections being formed between adjacent pairs of the die support member arms;
- a plurality of down set tie bars connecting the heat sink sections to adjacent ones of the die support member arms, wherein the heat sink sections lie in a plane below a plane of the die support member arms;
- a semiconductor die mounted to the X-shaped die support member;
- means for electrically coupling the semiconductor die to the plurality of leads; and
- a mold compound covering the semiconductor die, at least the inner lead portions of the leads, and the tie bars.

9. The semiconductor device of claim 8, wherein the mold compound covers the heat sink.

10. The semiconductor device of claim 9, wherein the heat sink sections are triangular.

11. The semiconductor device of claim 9, wherein the leads, the die support member, and the heat sink lie in three separate planes.

12. The semiconductor device of claim 9, wherein each arm of the die support member has a first portion of a first width and a second portion of a second width that is greater than the first width, wherein the second portions receive and support the semiconductor die.

13. The semiconductor device of claim 9, wherein the means for electrically coupling the semiconductor die to the plurality of leads comprises a plurality of wires.

14. The semiconductor device of claim 13, wherein the wires are connected to bonding pads on a surface of the semiconductor die and corresponding ones of the leads.

15. The semiconductor device of claim 9, wherein the mold compound fills an area between the heat sink sections and the die support member arms.

16. The semiconductor device of claim 15, wherein a thickness of the mold compound from the heat sink to an outer surface of the mold compound is about 14 mils.

17. A semiconductor device, comprising:
- a plurality of radially extending leads having inner lead portions and outer lead portions, wherein the inner lead portions define an open area having a central region;
- a generally X-shaped die support member having four arms located within the open area and meeting at the central region;
- a heat sink having four triangular sections, the heat sink sections being formed between adjacent pairs of the die support member arms;
- a plurality of down set tie bars connecting the heat sink sections to adjacent ones of the die support member arms, wherein the heat sink sections lie in a plane below a plane of the die support member arms;
- a semiconductor die mounted to the X-shaped die support member;
- a plurality of wires for electrically coupling the semiconductor die to the plurality of leads; and
- a mold compound covering the semiconductor die, the wires, the inner lead portions of the leads, the tie bars, and at least one surface of the heat sink sections.

18. The semiconductor device of claim 17, wherein the leads, the die support member, and the heat sink lie in three separate planes.

19. The semiconductor device of claim 17, wherein the heat sink sections are encompassed by the mold compound.

* * * * *